US011237488B2

(12) United States Patent
Jia et al.

(10) Patent No.: US 11,237,488 B2
(45) Date of Patent: Feb. 1, 2022

(54) SUBSTRATE CARRYING DEVICE, AND PHOTORESIST COATING DEVELOPMENT DEVICE

(71) Applicants: MIANYANG BOE OPTOELECTRONICS TECHNOLOGY CO., Ltd., Mianyang (CN); BOE TECHNOLOGY GROUP CO., LTD., Beijing (CN)

(72) Inventors: Guofeng Jia, Beijing (CN); Cui Zhang, Beijing (CN)

(73) Assignees: MIANYANG BOE OPTOELECTRONICS TECHNOLOGY CO., Ltd., Mianyang (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/928,059

(22) Filed: Jul. 14, 2020

(65) Prior Publication Data
US 2021/0063896 A1 Mar. 4, 2021

(30) Foreign Application Priority Data
Aug. 30, 2019 (CN) .......................... 201910818933.4

(51) Int. Cl.
*G03F 7/20* (2006.01)
*G03F 7/16* (2006.01)
*G03F 7/00* (2006.01)

(52) U.S. Cl.
CPC .......... *G03F 7/70758* (2013.01); *G03F 7/168* (2013.01); *G03F 7/70825* (2013.01); *G03F 7/0007* (2013.01)

(58) Field of Classification Search
CPC ...... G03F 7/0007; G03F 7/0025; G03F 7/168; G03F 7/30; G03F 7/3042; G03F 7/70716;
(Continued)

(56) References Cited

U.S. PATENT DOCUMENTS

2004/0150823 A1   8/2004   Yamamoto
2005/0282087 A1*  12/2005  Opower .............. G03F 7/70525
                                              430/311
(Continued)

FOREIGN PATENT DOCUMENTS

CN    104030033 A    9/2014
CN    105171408 A    12/2015
(Continued)

OTHER PUBLICATIONS

First Office Action for CN Patent Application No. 201910818933.4 dated Apr. 14, 2021.

*Primary Examiner* — Colin W Kreutzer
(74) *Attorney, Agent, or Firm* — Thomas | Horstemeyer, LLP

(57) ABSTRACT

This disclosure provides a substrate carrying device and a photoresist coating development device, and belongs to the field of display technologies. The substrate carrying device includes two carrying mechanisms opposite to each other, and a driving mechanism between the two carrying mechanisms. Each of carrying mechanisms includes a guiding assembly and a plurality of supports. The guiding assembly includes a guide and a moving member in cooperation with each other. The guide is configured to guide the moving member to move along a preset trajectory. The supports are secured to the moving member and are configured to carry the substrate together. The driving mechanism is capable of simultaneously driving movement of the moving members of the two carrying mechanisms.

20 Claims, 4 Drawing Sheets

(58) Field of Classification Search
CPC ............... G03F 7/7075; G03F 7/70758; G03F 7/70791; G03F 7/70825; H01L 21/6875; H01L 21/68764; H01L 21/68771; H01L 21/68785; H01L 21/68792
USPC ..... 355/27, 72, 77; 414/935–941; 430/270.1
See application file for complete search history.

(56) References Cited

U.S. PATENT DOCUMENTS

| 2006/0132735 | A1* | 6/2006 | Lof | G03F 7/70791 |
| | | | | 355/53 |
| 2014/0253896 | A1* | 9/2014 | Wu | G03F 7/703 |
| | | | | 355/71 |
| 2017/0365502 | A1* | 12/2017 | Kniknie | H01L 21/681 |
| 2019/0332015 | A1* | 10/2019 | Poiesz | H01L 21/6875 |

FOREIGN PATENT DOCUMENTS

| CN | 108455164 A | 8/2018 |
| CN | 108873626 A | 11/2018 |
| CN | 109019028 A | 12/2018 |

* cited by examiner

SUBSTRATE CARRYING DEVICE, AND PHOTORESIST COATING DEVELOPMENT DEVICE

CROSS-REFERENCE TO RELATED APPLICATION

This application is based on, and claims the benefit of and priority to, Chinese Patent Application No. 201910818933.4, filed on Aug. 30, 2019, the entire contents of which are incorporated herein by reference.

TECHNICAL FIELD

This disclosure relates to the field of display technologies and, in particular, to a substrate carrying device and a photoresist coating development device.

BACKGROUND

In a manufacturing process of a display panel, a trajectory process (a photoresist coating-exposure-development process) is often used. Before exposure, an interval between two substrates needs to be adjusted, so that these two substrates are matched with an exposure machine.

In the related art, the substrate is placed on fixed supporting pins and, as it is required to change the intervals between the substrates, a glass is pushed to slide on the supporting pins by the driving mechanism.

The information disclosed in the above "Background" section is merely intended to reinforce understanding of the background technology of the present disclosure. Accordingly the Background may include information that does not constitute prior art as already known by an ordinary person skilled in the art.

BRIEF SUMMARY

An object of the present disclosure is to provide a substrate carrying device and a photoresist coating development device, which is capable of avoiding damage to a substrate.

The object of this disclosure is achieved by using the following technical solutions.

According to a first aspect of the present disclosure, a substrate carrying device is provided. The substrate carrying device includes two carrying mechanisms opposite to each other; and a driving mechanism positioned between these two carrying mechanisms. Each of the carrying mechanisms includes: a guiding assembly including a guide and a moving member in cooperation with each other, wherein the guide is configured to guide the moving member to move along a preset trajectory; a plurality of supports secured to the moving member and configured to carry the substrate together. The driving mechanism is capable of simultaneously driving movement of moving members of the two carrying mechanisms.

In one exemplary embodiment of the present disclosure, the guide is a guide rail, and the moving member is a slider matched with the guide rail.

In one exemplary embodiment of the present disclosure, the support includes supporting pins connected with the moving member, and in one of the carrying mechanisms, ends of the supporting pins away from the moving member are on the same plane.

In one exemplary embodiment of the present disclosure, each of the carrying mechanisms further comprises a supporting plate. In one of the carrying mechanisms, the supporting plate is secured to the moving member, and the support is secured to the supporting plate and extends to a side away from the moving member.

In one exemplary embodiment of the present disclosure, in one of the carrying mechanisms, of the number of the supporting plate is in plural, and a plurality of supports are secured to each of the supporting plates.

In one exemplary embodiment of the present disclosure, the supporting plates are arranged at equal intervals.

In one exemplary embodiment of the present disclosure, in one of the carrying mechanisms, the number of the guiding assembly is in plural, the preset trajectories of the moving members of the guiding assemblies are parallel to each other, and the supporting plate is secured to all of moving members of the guiding assemblies.

In one exemplary embodiment of the present disclosure, the guiding assemblies are arranged at equal intervals and in parallel.

In one exemplary embodiment of the present disclosure, the preset trajectory of the moving member is a straight line, and the driving mechanism is capable of simultaneously driving movement of moving members of the two carrying mechanisms in opposite directions.

In one exemplary embodiment of the present disclosure, the driving mechanism includes: a rotation shaft, an axis of which is perpendicular to a plane in which a movement trajectory of each of supports is located; and two driving ends securely connected with the rotation shaft respectively. Moving members of the two carrying mechanisms are close to a side of the rotation shaft, and are matched with and correspond to the two driving ends one by one.

In one exemplary embodiment of the present disclosure, the driving mechanism includes: a rotation shaft, an axis of which is perpendicular to a plane in which a movement trajectory of each of supports is located; and two driving ends securely connected with the rotation shaft respectively. Supporting plates of the two carrying mechanisms are close to a side of the rotation shaft, and are matched with and correspond to the two driving ends one by one.

In one exemplary embodiment of the present disclosure, distances between the two driving ends and the axis of the rotation shaft are equal to each other.

In one exemplary embodiment of the present disclosure, distances between the moving members of the two carrying mechanisms and the axis of the rotation shaft are equal to each other.

In one exemplary embodiment of the present disclosure, each of the driving ends is connected to the rotation shaft by a connecting rod.

In one exemplary embodiment of the present disclosure, the number of the driving mechanism is in plural, and the driving mechanisms simultaneously drive movement of the moving members of the two carrying mechanisms.

According to a second aspect of the present disclosure, a photoresist coating development device is provided. The photoresist coating development device includes a substrate carrying device of each of the above embodiments of the present disclosure.

According to the substrate carrying device and the photoresist coating development device provided by the present disclosure, two substrates may be respectively carried by supports of two carrying mechanisms. As it is required to adjust distances between these two substrates, the driving mechanism may simultaneously drive moving members of these two carrying mechanisms to move along a preset trajectory. The moving member may drive the supports connected to the moving member to move along the same trajectory during movement of the moving member. The supports may drive the substrate carried by the supports to move along the same trajectory during movement of the supports. Thus, the supports and the substrate cannot move relative to each other, to prevent the substrate from being scratched due to a relative movement between the supports and the substrate, and to avoid static electricity generated due to the relative movement between the supports and the substrate, thereby ensuring intactness of the substrate, avoiding influence of the static electricity on subsequent processes, and improving a yield of display panels in practice. Moreover, in this way, precision of alignment can be ensured, and requirements of the exposure machine can be satisfied.

BRIEF DESCRIPTION OF THE DRAWINGS

The above-described and other features and advantages of the present disclosure will become more apparent from the detailed descriptions of exemplary embodiments with reference with the accompanying drawings.

DETAILED DESCRIPTION

Figure 1:
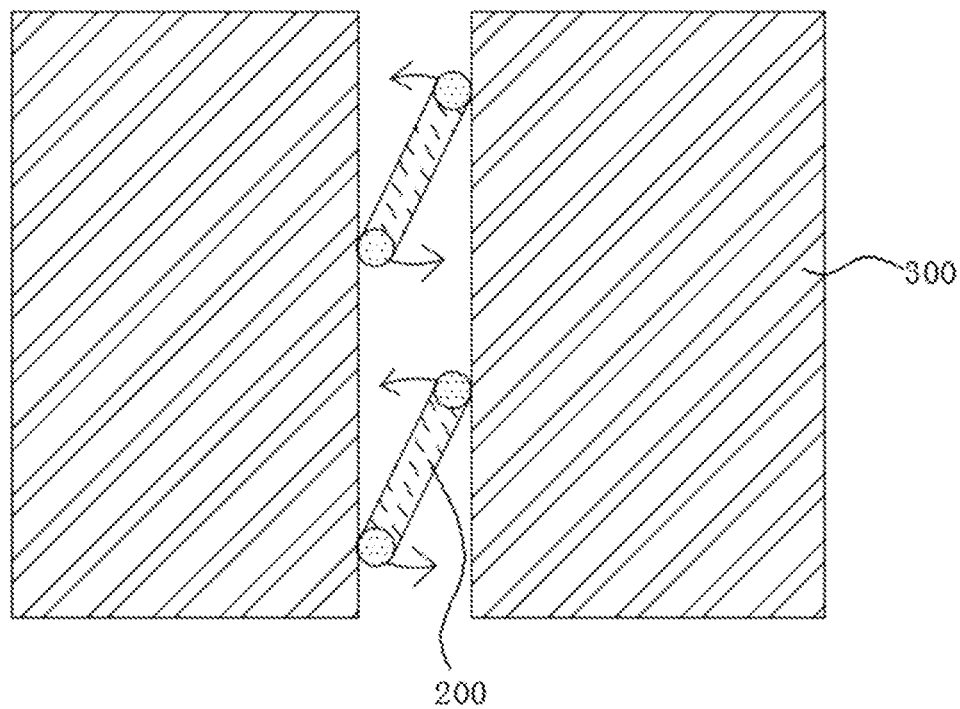
FIG. 1 is a schematic top view of a substrate carrying device in the related art.

Now, the exemplary embodiments will be described more fully with reference to the accompanying drawings. However, the exemplary embodiments can be embodied in a variety of forms and should not be construed as limiting the embodiments set forth herein. Instead, these embodiments are provided so that the present disclosure will be thorough and complete, and the concepts of the exemplary embodiments will be fully given to those skilled in the art. The features, structures, or characteristics described herein may be combined in one or more embodiments in any suitable manner. In the following description, numerous specific details are provided to fully understand the embodiments of the present disclosure.

In the drawings, thicknesses of regions and layers may be exaggerated for sake of clarity. Same reference numbers denote the same or similar structures in the figures, and thus the detailed description thereof will be omitted.

Figure 2:
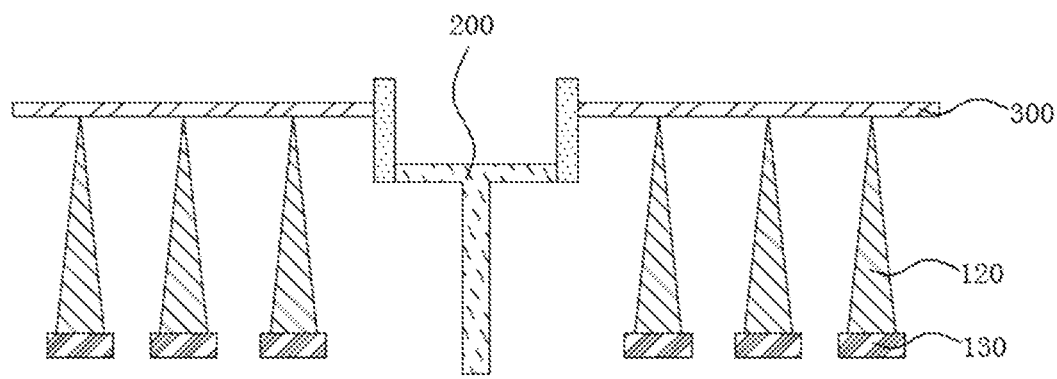
FIG. 2 is a schematic front view of a substrate carrying device in the related art.
Figure 3:
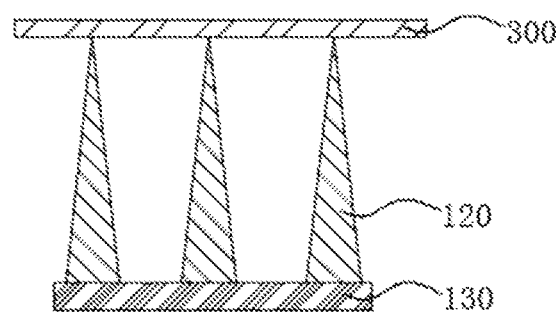
FIG. 3 is a schematic side view of a substrate carrying device in the related art.

In the related art, as shown in FIGS. 1 to 3, a substrate carrying device includes a supporting plate 130 and a pin-shaped support 120 secured to the supporting plate 130, where a position of the supporting plate 130 is fixed. The substrate 300 is placed on the support 120 and, as it is required to change an interval between substrates 300, the substrate 300 is pushed by a driving mechanism 200 to slide on the support 120. However, when a glass substrate and the supporting pins 120 move relative to each other, the substrate 300 is easily scratched and generates static electricity, so as to reduce a yield of display panels.

Figure 4:
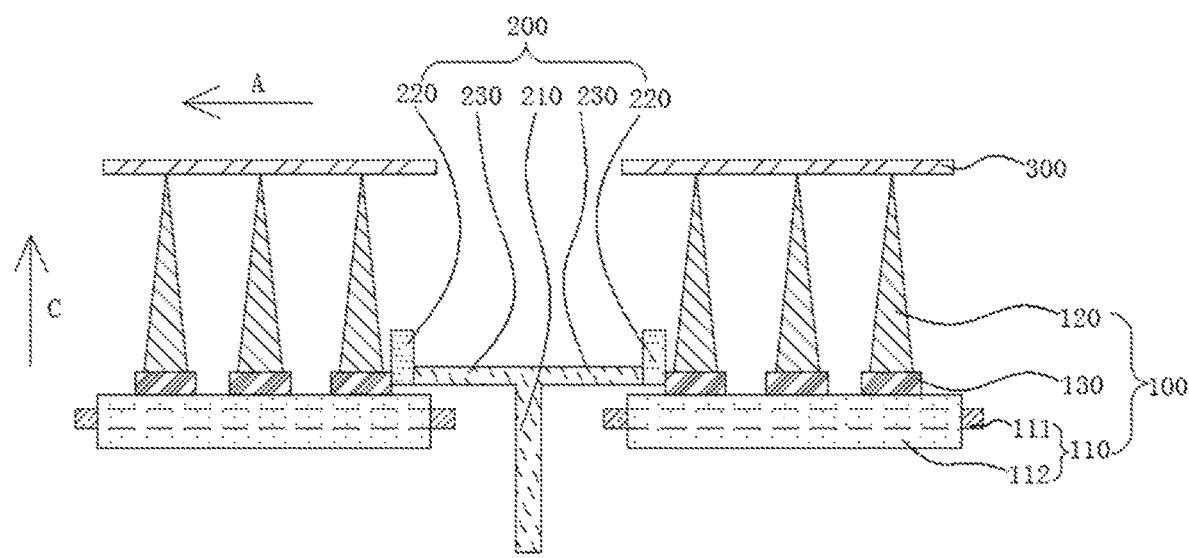
FIG. 4 is a schematic front view of a substrate carrying device according to an embodiment of the present disclosure.
Figure 5:
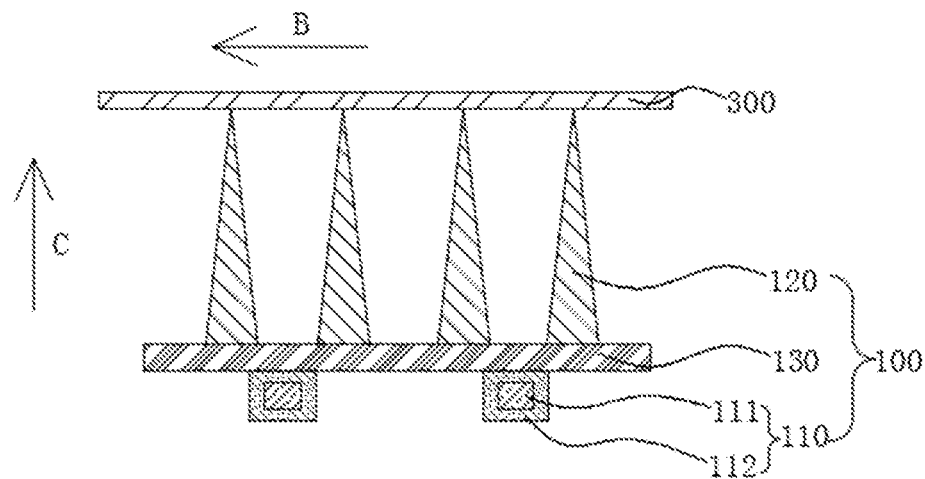
FIG. 5 is a schematic side view of a substrate carrying device according to an embodiment of the present disclosure.
Figure 6:
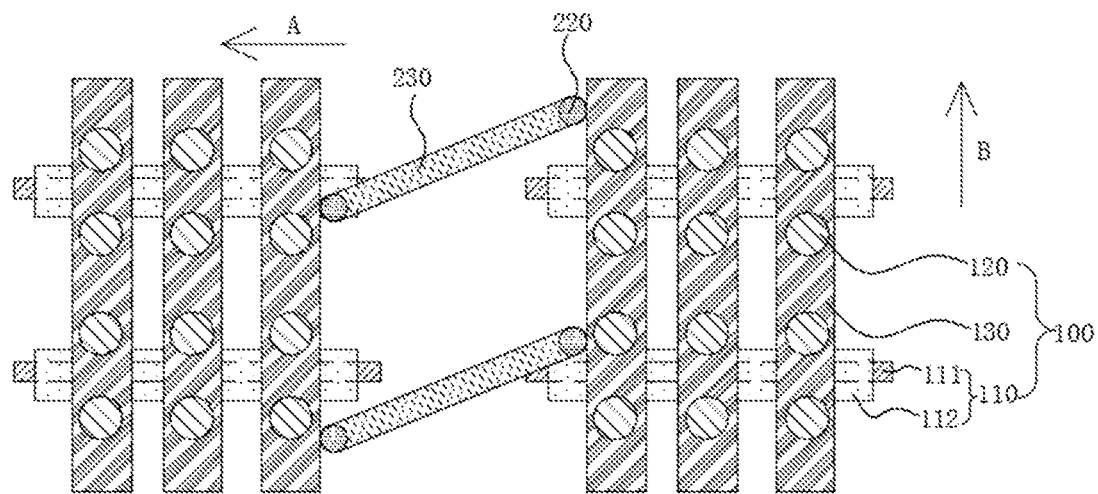
FIG. 6 is a schematic top view of a substrate carrying device according to an embodiment of the present disclosure.

In order to solve the above problems, an embodiment of the present disclosure provides a substrate carrying device, as shown in FIGS. 4 to 6. The substrate carrying device includes two carrying mechanisms 100 opposite to each other, and a driving mechanism 200 positioned between these two carrying mechanisms 100. Each of the carrying mechanisms 100 includes a guiding assembly 110 and a plurality of supports 120, wherein the guiding assembly 110 includes a guide 111 and a moving member 112 in cooperation with each other and the guide 111 is configured to guide the moving member 112 to move along a preset trajectory. A plurality of supports 120 are secured to the moving member 112 and configured to carry the substrate 300 together. The driving mechanism 200 is capable of simultaneously driving movement of the moving members 112 of the two carrying mechanisms 100.

According to the substrate carrying device provided by the present disclosure, two substrates 300 may be respectively carried by supports 120 of the two carrying mechanisms 100. As it is required to adjust a distance between these two substrates 300, the driving mechanism 200 may simultaneously drive moving members 112 of the two carrying mechanisms 100 to move along a preset trajectory. The moving member 112 may drive the supports 120 connected to the moving member to move along the same trajectory during movement of the moving member, and the supports 120 may drive the substrate 300 carried by the supports to move along the same trajectory during movement of the supports. Thus, the supports 120 and the substrate 300 cannot move relative to each other, to prevent the substrate 300 from being scratched due to the relative movement between the supports 120 and the substrate 300, to avoid static electricity generated due to the relative movement between the supports 120 and the substrate 300, thereby ensuring intactness of the substrate 300, avoiding influence of the static electricity on subsequent processes, and improving a yield of display panels in practice.

Various components of the substrate carrying device according to the embodiments of the present disclosure will be described in detail with reference to the accompanying drawings.

As shown in FIG. 4, the substrate carrying device includes two carrying mechanisms 100 opposite to each other, and each carrying mechanism 100 may carry one substrate 300. The two carrying mechanisms 100 opposite to each other refers to that two carrying mechanisms 100 are disposed at both sides of the driving mechanism 200, respectively. The substrate 300 may be a glass substrate, a back plate provided with a driving circuit, or other types of substrates, and this disclosure is not specifically limited thereto.

In the guiding assembly 110, the guide 111 is configured to support the moving member 112 and constrain a moving trajectory of the moving member 112, such that the moving member 112 moves according to a preset trajectory. The moving member 112 is configured to connect the supports 120, and drive the supports 120 to move synchronously during movement of the moving member. The preset trajectory of the moving member 112 may be a straight line, a broken line, an arc line, or other shapes. For example, in one embodiment of the present disclosure, the preset trajectory of the moving member 112 is a straight line.

Optionally, the guide 111 is secured to a bracket so as to remain the guide stationary and prevent the guide from being moved to offset a position of the substrate 300, thereby ensuring the subsequent exposure accuracy.

Optionally, the guiding assembly 110 may include a guide rail 1110 and sliders 1120 matched with the guide rail 1110, wherein the guide rail 1110 is secured to one of the sliders 1120, serving as the guide 111, and another slider is securely connected to the support 120, serving as the moving member 112. For example, in one embodiment of the present disclosure, the guide 111 is a guide rail 1110, and the moving member 112 is a slider 1120 matched with the guide rail 1110. The guide 1110 may be in contact with the slider 1120 through a surface, a line, rolling, or in other possible mutual contact manners, so as to allow relative movement therebetween.

Figure 7:
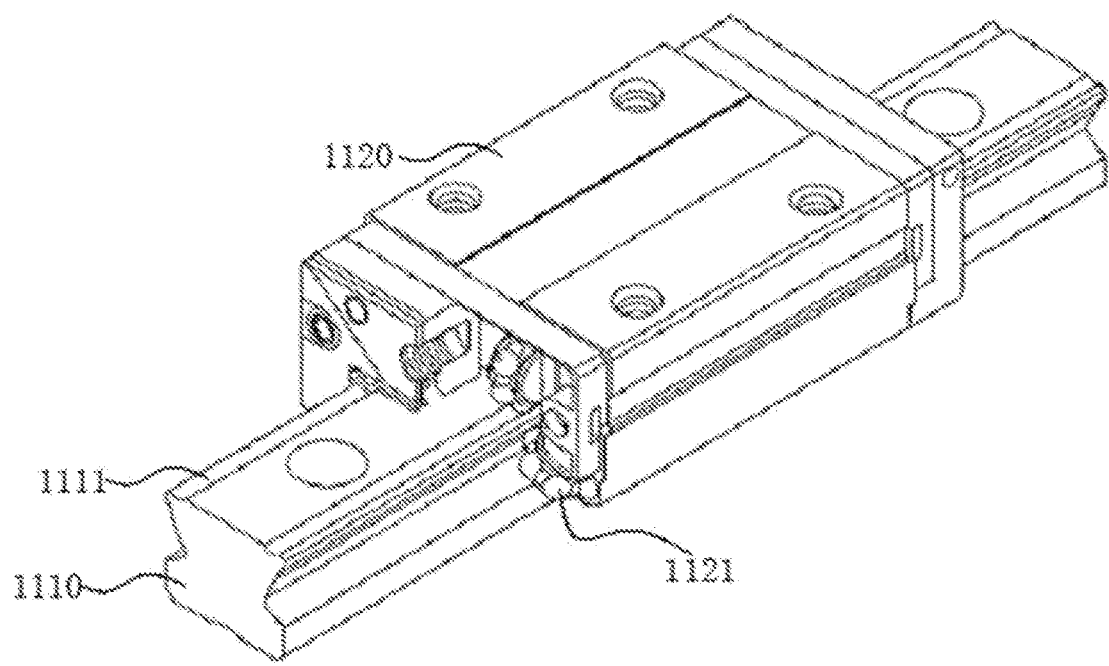
FIG. 7 is a schematic partial cross-sectional structural view of a guide rail slider assembly according to an embodiment of the present disclosure.
Figure 8:
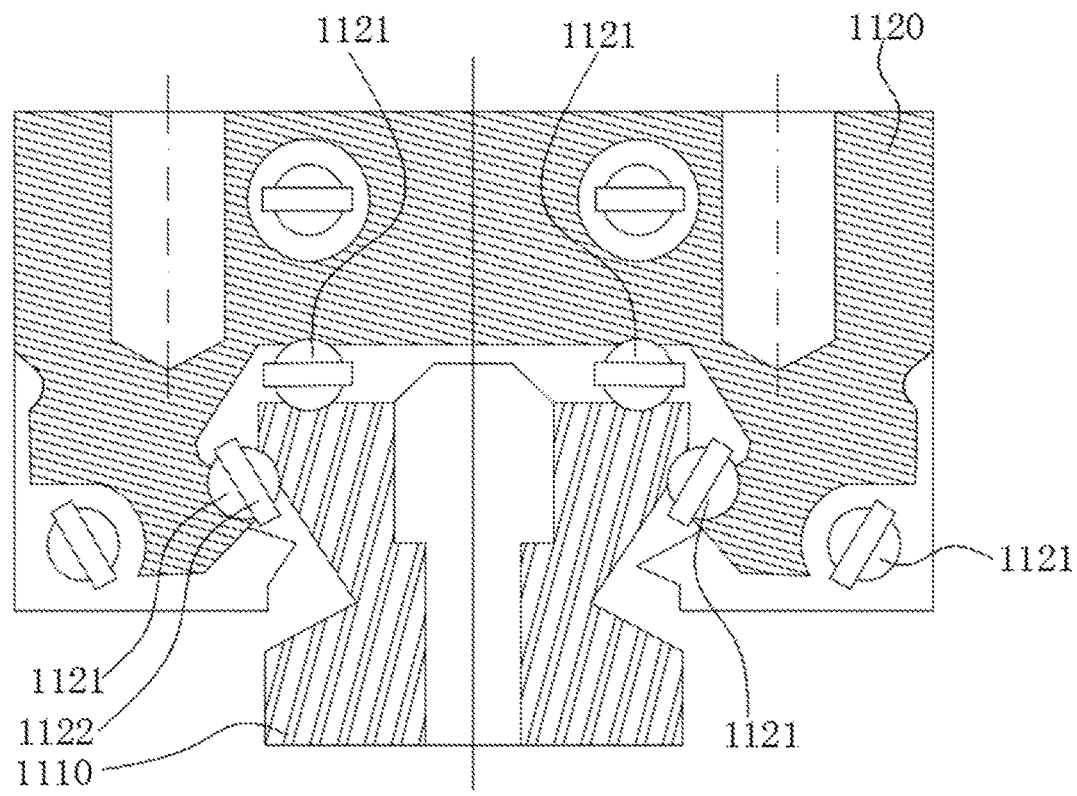
FIG. 8 is a cross-sectional structural schematic view of a guide rail slider assembly according to an embodiment of the present disclosure.

For example, in one embodiment of the present disclosure, as shown in FIG. 7 and FIG. 8, the guide rail 1110 and the slider 1120 are fitted to one another, for example, clamped to each other, such that the slider 1120 can move only along an extending direction of the guide rail 1110. A raceway 1111 may be provided on the guide rail 1110, and a ball 1121 may be provided on the slider 1120. The ball 1121 cooperates with the raceway 1111 to reduce a resistance between the slider 1120 and the trajectory. Optionally, the guide rail 1110 is provided with four raceways 1111, the slider 1120 is provided with four sets of balls 1121, and the four raceways 1111 correspond to the four sets of balls 1121 one by one. Optionally, a ball retainer 1122 may be provided on the slider 1120 to prevent the balls 1121 from falling off the slider 1120. Optionally, an end cover plate may be further provided on an end side of the slider 1120 to cover and protect the balls 1121 on the slider 1120. Further, a sealing gasket matched with the guide rail 1110 may be further provided on the end cover plate, so as to seal between the end cover plate and the guide rail 1110, to prevent dust or the like from getting into a space between the balls 1121 or getting into the raceway 1111, so as to increase resistance between the slider 1120 and the guide rail 1110.

In one of the carrying mechanisms 100, the number of the guiding assembly 110 may be one or in plural. When the number of the guiding assembly 110 is in plural, as shown in FIGS. 5 and 6, guides 111 of the guiding assemblies 110 may be arranged in parallel to each other, so that preset trajectories of moving members 112 are parallel to each other, thereby ensuring the moving members 112 to move synchronously, and preventing the relative movement between the substrate 300 and the supports 120 on the moving members 112 due to change of the interval therebetween. For example, each of the guides 111 may guide a corresponding moving member 112 to linearly move in the first direction A synchronously, or linearly move in a direction opposite to the first direction A synchronously. Optionally, the first direction A may be parallel to a horizontal plane, that is, the first direction A may be perpendicular to a vertical direction C.

Herein, in the present disclosure, the preset trajectories of the moving members 112 being parallel to each other refers to that tangential directions of the preset trajectories of the moving members 112 are parallel to each other. It should be understood that, when the preset trajectory of the moving member 112 is a straight line, the tangential direction of the moving trajectory of the moving member 112 is a direction parallel to the preset trajectory.

All the supports 120 in one of the carrying mechanisms 100 are configured to carry the substrate 300 together. Each of the supports 120 may be cylindrical, block-shaped, disc-shaped, pin-shaped, or other feasible shapes. It should be understood that, as shown in FIG. 4 and FIG. 5, in one of the carrying mechanisms 100, ends of all the supports 120 away from the moving member 112 may be located on the same plane to form a carrying plane for carrying the substrate 300. In one embodiment of the present disclosure, the carrying plane formed by ends of all the supports 120 in one of the carrying mechanisms 100 away from the moving member 112 is higher than the moving member 112 in the vertical direction C. The formed carrying plane may be a horizontal plane or a nearly horizontal plane.

For example, in one embodiment of the present disclosure, as shown in FIG. 4 and FIG. 5, the supports 120 may include pin-shaped supporting pins connected with the moving member 112. In one of the carrying mechanisms 100, ends of the supporting pins away from the moving member 112 are located on the same plane to form a carrying plane for carrying the substrate 300. A cross-sectional area of an end of the supporting pin away from the moving member 112 is smaller than a cross-sectional area of an end of the supporting pin close to the moving member 112.

Optionally, as shown in FIG. 4 to FIG. 6, each of the carrying mechanisms 100 may further include a supporting plate 130. In one of the carrying mechanisms 100, the supporting plate 130 is secured to the moving member 112, and the support 120 is secured to the supporting plate 130 and extends to a side away from the moving member 112. As such, the support 120 is indirectly connected to the moving member 112 through the supporting plate 130. In one embodiment of the present disclosure, the support 120 may be secured to the supporting plate 130 in advance, and the support 120 may be secured to the moving member 112 by securing the supporting plate 130 to the moving member 112, so that the assembly process of the carrying mechanism 100 may be simplified. In another embodiment of the present disclosure, the support 120 and the supporting plate 130 may be an integrated structure, which may be simultaneously manufactured in an integral forming manner. In this way, the manufacturing process of the support 120 and the supporting plate 130 can be simplified, the number of parts of the carrying mechanism 100 can be reduced, and the assembly efficiency of the carrying mechanism 100 can be improved.

In one of the support mechanisms 100, the number of the supporting plate 130 may be one or in plural. In one embodiment of the present disclosure, one carrying mechanism 100 is provided with one supporting plate 130, and all the supports 120 of the carrying mechanism 100 are secured to the supporting plate 130. In another embodiment of the present disclosure, as shown in FIG. 4 to FIG. 6, one carrying mechanism 100 is provided with a plurality of supporting plates 130, and each of the supporting plates 130 is connected with a plurality of supports 120. In some embodiments, a plurality of supporting plates 130 are secured to the moving member 112 at equal intervals, and extending directions of supporting plates 130 are parallel to each other. On each of the supporting plate 130 is arranged the same number of supports 120 at equal intervals, and distances between the supports 120 on the supporting plates 130 are equal to one another. Thus, the supports 120 may be uniformly distributed, so as to provide uniform support for the substrate 300, and prevent the substrate 300 from being offset due to non-uniform supporting force. In some embodiments, the extending direction of the supporting plate 130 may be perpendicular to the preset trajectory of the moving member 112.

Optionally, as shown in FIG. 4 to FIG. 6, in one of the carrying mechanisms 100, as the number of the guiding assembly 110 is in plural, moving members 112 of the guiding assemblies 110 may be connected to each other through the supporting plates 130, so that moving members 112 can move synchronously. In this way, the driving mechanism 200 may be directly matched with the moving members 112, and may also be matched with the supporting plates 130 to finally drive the moving members 112 to move synchronously along the preset trajectories parallel to each other.

As shown in FIG. 4 to FIG. 6, the driving mechanism 200 may be provided between two carrying mechanisms 100, so as to simultaneously drive movement of moving members 112 of the two carrying mechanisms 100. Optionally, moving directions of the moving members 112 of the two carrying mechanisms 100 driven by the driving mechanism 200 may be opposite to each other. For example, in one embodiment of the present disclosure, the preset trajectory of the moving member 112 is a straight line, and the driving mechanism 200 is capable of simultaneously driving movement of the moving members 112 of the two carrying mechanisms 100 in opposite directions. In other words, when the driving mechanism 200 is operated, the moving member 112 of one carrying mechanism 100 may move linearly in a first direction A, and the moving member 112 of the other carrying mechanism 100 may move linearly in a direction opposite to the first direction A.

The driving mechanism 200 may be a two-way screw mechanism, a slider-crank mechanism, or other feasible mechanism. The driving mechanism 200 may include a drive end for acquiring power, and two driven ends that are movable under the control of the drive end. The drive end of the driving mechanism 200 may be connected with a power mechanism so as to acquire power for driving the carrying mechanisms 100. Two driven ends are respectively matched with the carrying mechanisms 100, for example, they are respectively matched with the moving members 112 or the supporting plates 130 of the carrying mechanisms 100, so that the two driven ends may respectively drive the moving members 112 of the two carrying mechanisms 100 to move along the preset trajectories.

The number of the driving mechanism 200 may be one or in plural. For example, as shown in FIG. 6, the number of the driving mechanisms 200 in the substrate carrying device is in plural, and a plurality of the driving mechanisms 200 simultaneously drive movement of the moving members 112 of two carrying mechanisms 100.

Optionally, as shown in FIG. 4 to FIG. 6, the driving mechanism 200 includes a rotation shaft 210 and two driving ends 220. An axial direction of the rotation shaft 210 is perpendicular to a plane in which moving trajectories of the supports 120 are located, that is, the axial direction of the rotation shaft 210 is perpendicular to a carrying plane formed by the supports 120. The rotation shaft 210 may be connected to a power mechanism as a drive end of the driving mechanism 200, and may be driven by the power mechanism to rotate along a circumferential direction of the rotation shaft 210. The power mechanism may be a rotary oil cylinder, a rotary air cylinder, a stepping motor, or other power mechanisms capable of providing torque, and the present disclosure is not limited thereto. Further, distances between moving members 112 of the two carrying mechanisms 100 and an axis of the rotation shaft 210 are equal to each other, so that the driving mechanism 200 drives the moving members 112 of the two carrying mechanisms 100 to move synchronously.

The two driving ends 220 are securely connected to the rotation shaft 210 respectively, and are driven by the rotation shaft 210 to move along the circumferential direction of the rotation shaft 210. The two driving ends 220 serve as two driven ends of the driving mechanism 200, and are respectively matched with the two carrying mechanisms 100, so as to respectively drive the moving members 112 of the two carrying mechanisms 100 to move along preset trajectories.

The driving end 220 may be matched with the moving member 112 of the carrying mechanism 100, and may also be matched with the supporting plate 130 of the carrying mechanism 100. In one embodiment of the present disclosure, the driving end 220 may slidably abut against a side of the moving member 112 or the supporting plate 130 close to the rotation shaft 210. When the driving end 220 moves to a side close to the moving member 112 or the supporting plate 130 along a circular arc trajectory, the moving member 112 may be driven to move in a direction away from the rotation shaft 210 along the preset trajectory.

For example, in one embodiment of the present disclosure, as shown in FIG. 4, sides of the supporting plates 130 of the two carrying mechanisms 100 close to the rotation shaft 210 are matched with and correspond to the two driving ends 220 one by one.

For another example, in another embodiment of the present disclosure, sides of the moving members 112 of the two carrying mechanisms 100 close to the rotation shaft are matched with and correspond to the two driving ends 220 one by one.

As shown in FIG. 4, distances between two driving ends 220 and an axis of the rotation shaft 210 may also be equal to one another. In this way, curvatures of the moving trajectories of the two driving ends 220 are equal to one another, so that the moving members 112 of the two carrying mechanisms 100 may move synchronously. Further, each of the two driving ends 220 may have a cylindrical shape, and an axial direction of the driving ends 220 is parallel to an axial direction of the rotation shaft 210. Thus, the driving ends 220 may be in smooth contact with the moving members 112 or the supports 120 during movement.

As shown in FIG. 4, the driving ends 220 may be connected with the rotation shaft 210 through a connecting rod 230 (for example, a connecting straight rod). Optionally, an axial direction of the connecting rod 230 is perpendicular to the axial direction of the rotation shaft 210. Optionally, orthographic projections of two driving ends 220 in the axial direction of the rotation shaft 210 may coincide with each other.

A specific embodiment of the substrate carrying device is exemplarily provided below to further explain and describe principles and effects of the substrate carrying device of the present disclosure.

In this example, as shown in FIG. 4 to FIG. 6, the substrate carrying device includes two carrying mechanisms 100 opposite to each other, and a driving mechanism 200 provided between the two carrying mechanisms 100. Each of the carrying mechanisms 100 includes a plurality of guiding assemblies 110, a plurality of supporting plates 130 and a plurality of supports 120.

The guiding assembly 110 is a linear guide rail slider assembly, including a guide rail 1110 and a slider 1120 in cooperation with each other. The guide rail 1110 serves as a guide 111 of the guiding assembly 110 and may be secured to a bracket. An extending direction of the guide rail 1110 is a first direction A. The slider 1120 serves as a moving member 112 of the guiding assembly 110 for linear movement in the first direction A or a direction opposite to the first direction A under guidance of the guide rail 1110. All of the moving members 112 in one carrying mechanism 100 are driven by the driving mechanism 200 and guided by the guide rail 1110 to move linearly along the first direction A. All of the moving members 112 in the other carrying mechanism 100 are driven by the driving mechanism 200 and guided by the guide rail 1110 to move linearly in a direction opposite to the first direction A. The first direction A is perpendicular to the vertical direction C.

As shown in FIG. 5 and FIG. 6, in one of the carrying mechanisms 100, a plurality of guide rails 1110 are arranged at equal intervals and in parallel along a second direction B. The second direction B is perpendicular to the first direction A and the vertical direction C. An extending direction of each of supporting plates 130 is the second direction B, and each of supporting plates 130 is secured to upper surfaces of all of the sliders 1120 simultaneously. A plurality of supporting plates 130 are arranged at equal intervals in the first direction A. In this manner, the supporting plate 130 enables the respective sliders 1120 to connect with each other, and ensures that the supporting plates 130 move linearly in the first direction A or in a direction opposite to the first direction A synchronously. Moreover, the guide rails 1110 and the supporting plates 130 are arranged at equal intervals, so that the guiding assembly 110 provides an even supporting force for the supporting plate 130, and prevents the supporting plate 130 from being unevenly stressed and being offset, and further, prevents the supporting plate 130 from being offset and thus leading to an inaccurate position of the substrate 300. In one of the carrying mechanisms 100, the supports 120 are uniformly arranged on the supporting plates 130 and extend in a direction away from the slider 1120, that is, the supports 120 are secured to each of the supporting plates 130 at equal intervals, and distances between the supports 120 on different supporting plates 130 are equal to one another. Thus, the supports 120 are uniformly distributed, so as to provide a more uniform supporting force for the substrate 300, and prevent the substrate 300 from being offset or damaged due to non-uniform stress.

As shown in FIG. 4 to FIG. 6, the support 120 is a pin-shaped supporting pin, and a cross-sectional area of an end (i.e. a lower end) of the supporting pin close to the slider 1120 is larger than that of an end (i.e. an upper end) of the supporting pin away from the slider 1120, so that the supporting pin has sufficient strength. In one of the carrying mechanisms 100, ends of supporting pins away from the slider 1120 are located on the same plane to form a carrying plane of the carrying mechanism 100 for carrying the substrate 300. The carrying planes of the two carrying substrates 300 are located on the same plane.

As shown in FIG. 6, the number of the driving mechanisms 200 is two, and each of the driving mechanisms is positioned between two carrying mechanisms 100 and is arranged along the second direction B. As shown in FIG. 4 to FIG. 6, each of the driving mechanisms 200 includes a rotation shaft 210 and two driving ends 220, and the rotation shaft 210 and the two driving ends 220 are connected through two connecting rods 230.

The axis of the rotation shaft 210 is a vertical direction C, the rotation shaft 210 serves as a drive end of the driving mechanism 200. An end of the rotation shaft is configured to connect with a power mechanism for providing torque, and the other end of the rotation shaft is connected with the driving end 220 through a connecting rod 230. The rotation shaft 210 may be driven by the power mechanism to rotate along a circumferential direction thereof, so as to drive the driving end 220 to move along the circular arc-shaped trajectory. The power mechanism may be a rotary oil cylinder, a rotary air cylinder, a stepping motor, or other power mechanism capable of providing torque, and the power mechanism may be secured to the bracket, so that the rotation shaft 210 and the guide rail 1110 remain relatively stationary.

The axes of the two connecting rods 230 are in the same straight line and perpendicular to the vertical direction C, and the two connecting rods 230 are respectively located at two sides of the rotation shaft 210. The two driving ends 220 correspond to and are connected to the ends of two connecting rods 230 away from the rotation shaft 210 one by one. Each of driving ends 220 is cylindrical, and the axial direction of the driving end 220 is the vertical direction C. The axis of the connecting rod passes through the axis of the rotation shaft 210 and the axis of the driving end 220.

The embodiments of the present disclosure further provide a photoresist coating development device, including any one of the substrate carrying devices described in the above embodiments of the substrate carrying device. The photoresist coating development device may be a device for performing photoresist coating and exposure in a photolithography process. Since the photoresist coating development device has any one of the substrate carrying devices described in the above embodiments of the substrate carrying device, thereby having the same beneficial effects, and details thereof would not be repeated in the present disclosure.

It should be understood that application of the present disclosure is not limited to the detailed structure and arrangement of components provided in the present specification. This disclosure can have other embodiments, and can be implemented and carried out in various ways. The foregoing variations and modifications fall within the scope of the present disclosure. It should be understood that this disclosure disclosed and defined in this specification may extend to all alternative combinations of two or more of the individual features that are mentioned or apparent from the text and/or drawings. All of these different combinations form various alternative aspects of the present disclosure. The embodiments described herein explain the best modes known for carrying out the present disclosure, and will allow those skilled in the art to utilize this disclosure.

What is claimed is:

1. A substrate carrying device, comprising:
two carrying mechanisms opposite to each other; and
a driving mechanism between the two carrying mechanisms, wherein each of the carrying mechanisms comprises:
 a guiding assembly comprising a guide and a moving member in cooperation with each other, wherein the guide is configured to guide the moving member to move along a preset trajectory;
 a plurality of supports secured to the moving member and configured to carry the substrate together, wherein the driving mechanism is capable of simultaneously driving movement of moving members of the two carrying mechanisms,
wherein the driving mechanism comprises:
 a rotation shaft, an axis of which being perpendicular to a plane in which a movement trajectory of each of the plurality of supports is located; and
 two driving ends securely connected with the rotation shaft respectively, wherein moving members of the two carrying mechanisms are close to a side of the rotation shaft, and are matched with and correspond to the two driving ends one by one.

2. The substrate carrying device of claim 1, wherein the guide is a guide rail, and the moving member is a slider matched with the guide rail.

3. The substrate carrying device of claim 1, wherein the support comprises supporting pins connected with the moving member, and in one of the carrying mechanisms, ends of the supporting pins away from the moving member are on the same plane.

4. The substrate carrying device of claim 1, wherein:
each of the carrying mechanisms further comprises a supporting plate;
in one of the carrying mechanisms, the supporting plate is secured to the moving member; and
the support is secured to the supporting plate and extends to a side away from the moving member.

5. The substrate carrying device of claim 4, wherein in one of the carrying mechanisms, the number of the supporting plate is in plural, and a plurality of supports are secured to each of the supporting plates.

6. The substrate carrying device of claim 5, wherein a plurality of the supporting plates are arranged at equal intervals.

7. The substrate carrying device of claim 4, wherein in one of the carrying mechanisms, the number of the guiding assembly is in plural, the preset trajectories of the moving members of the guiding assemblies are parallel to each other, and the supporting plate is secured to all of moving members of the guiding assemblies.

8. The substrate carrying device of claim 7, wherein the guiding assemblies are arranged at equal intervals and in parallel.

9. The substrate carrying device of claim 1, wherein the preset trajectory of the moving member is a straight line, and the driving mechanism is capable of simultaneously driving movement of moving members of the two carrying mechanisms in opposite directions.

10. The substrate carrying device of claim 4, wherein supporting plates of the two carrying mechanisms are close to a side of the rotation shaft, and are matched with and correspond to the two driving ends one by one.

11. The substrate carrying device of claim 1, wherein distances between the two driving ends and the axis of the rotation shaft are equal to each other.

12. The substrate carrying device of claim 1, wherein distances between of the moving members of the two carrying mechanisms and the axis of the rotation shaft are equal to each other.

13. The substrate carrying device of claim 8, wherein each of the driving ends is connected to the rotation shaft by a connecting rod.

14. The substrate carrying device of claim 1, wherein the number of the driving mechanism is in plural, and the driving mechanisms simultaneously drive movement of the moving members of the two carrying mechanisms.

15. A photoresist coating development device comprises a substrate carrying device, wherein the substrate carrying device comprises:
two carrying mechanisms opposite to each other; and
a driving mechanism between the two carrying mechanisms, wherein each of the carrying mechanisms comprises:
a guiding assembly comprising a guide and a moving member in cooperation with each other, wherein the guide is configured to guide the moving member to move along a preset trajectory; and
a plurality of supports secured to the moving member and configured to carry the substrate together, wherein the driving mechanism is capable of simultaneously driving movement of moving members of the two carrying mechanisms,
wherein the driving mechanism comprises:
a rotation shaft, an axis of which being perpendicular to a plane in which a movement trajectory of each of supports is located; and
two driving ends securely connected with the rotation shaft respectively, wherein moving members of the two carrying mechanisms are close to a side of the rotation shaft, and are matched with and correspond to the two driving ends one by one.

16. The photoresist coating development device of claim 15, wherein:
each of the carrying mechanisms further comprises a supporting plate;
in one of the carrying mechanisms, the supporting plate is secured to the moving member; and
the support is secured to the supporting plate and extends to a side away from the moving member.

17. The photoresist coating development device of claim 15, wherein the preset trajectory of the moving member is a straight line, and the driving mechanism is capable of simultaneously driving movement of moving members of the two carrying mechanisms in opposite directions.

18. The photoresist coating development device of claim 16, wherein supporting plates of the two carrying mechanisms are close to a side of the rotation shaft, and are matched with and correspond to the two driving ends one by one.

19. A substrate carrying device, comprising:
two carrying mechanisms opposite to each other; and
a driving mechanism between the two carrying mechanisms, wherein each of the carrying mechanisms comprises:
a plurality of guiding assemblies comprising a guide and a moving member in cooperation with each other, the guide being configured to guide the moving member to move along a preset trajectory;
a plurality of supports secured to the moving member configured to carry the substrate together, the driving mechanism being configured to simultaneously drive movement of moving members of the two carrying mechanisms;
a supporting plate, wherein, in one of the carrying mechanisms, the supporting plate is secured to the moving member, and the support is secured to the supporting plate and extends to a side away from the moving member; and
wherein, in the one of the carrying mechanisms, the preset trajectories of the moving members of the guiding assemblies are parallel to each other, and the supporting plate is secured to all of moving members of the guiding assemblies.

20. The substrate carrying device of claim 19, wherein the guiding assemblies are arranged at equal intervals and in parallel.

* * * * *